(12) United States Patent
Wells et al.

(10) Patent No.: US 9,355,897 B2
(45) Date of Patent: *May 31, 2016

(54) METHODS OF FORMING SEMICONDUCTOR STRUCTURES

(71) Applicant: Micron Technology, Inc., Boise, ID (US)

(72) Inventors: David H. Wells, Boise, ID (US); Gurtej S. Sandhu, Boise, ID (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/607,921

(22) Filed: Jan. 28, 2015

(65) Prior Publication Data
US 2015/0140803 A1   May 21, 2015

Related U.S. Application Data

(62) Division of application No. 14/034,014, filed on Sep. 23, 2013, now Pat. No. 9,006,859, which is a division of application No. 13/175,468, filed on Jul. 1, 2011, now Pat. No. 8,552,525.

(51) Int. Cl.
H01L 21/768   (2006.01)
H01L 21/06    (2006.01)
H01L 21/761   (2006.01)
H01L 27/12    (2006.01)
H01L 45/00    (2006.01)
(Continued)

(52) U.S. Cl.
CPC ........ *H01L 21/76843* (2013.01); *H01L 21/743* (2013.01); *H01L 21/761* (2013.01); *H01L 21/76802* (2013.01); *H01L 21/84* (2013.01); *H01L 27/1027* (2013.01); *H01L 27/1203* (2013.01); *H01L 27/2472* (2013.01); *H01L 29/06* (2013.01); *H01L 45/06* (2013.01); *H01L 45/1233* (2013.01); *H01L 45/16* (2013.01)

(58) Field of Classification Search
None
See application file for complete search history.

(56) References Cited

U.S. PATENT DOCUMENTS 4,853,348 A    8/1989   Tsubouchi et al.
5,112,771 A    5/1992   Ishii et al.
(Continued)

OTHER PUBLICATIONS

Definition of "fill", http://education.yahoo.com/reference/dictionary/entry/fill, 1 page, viewed May 2, 2013.
(Continued)

Primary Examiner — Joseph Schoenholtz
(74) Attorney, Agent, or Firm — TraskBritt

(57) ABSTRACT

Methods of forming semiconductor structures that include bodies of a semiconductor material disposed between rails of a dielectric material are disclosed. Such methods may include filling a plurality of trenches in a substrate with a dielectric material and removing portions of the substrate between the dielectric material to form a plurality of openings. In some embodiments, portions of the substrate may be undercut to form a continuous void underlying the bodies and the continuous void may be filled with a conductive material. In other embodiments, portions of the substrate exposed within the openings may be converted to a silicide material to form a conductive material under the bodies. For example, the conductive material may be used as a conductive line to electrically interconnect memory device components. Semiconductor structures and devices formed by such methods are also disclosed.

20 Claims, 6 Drawing Sheets

(51) Int. Cl.
*H01L 21/84* (2006.01)
*H01L 27/24* (2006.01)
*H01L 21/74* (2006.01)
*H01L 27/102* (2006.01)
*H01L 29/06* (2006.01)

(56) References Cited

U.S. PATENT DOCUMENTS

| | | | |
|---|---|---|---|
| 5,426,070 | A | 6/1995 | Shaw et al. |
| 5,943,581 | A | 8/1999 | Lu et al. |
| 6,051,866 | A | 4/2000 | Shaw et al. |
| 6,242,770 | B1 | 6/2001 | Bronner et al. |
| 6,319,788 | B1 | 11/2001 | Gruening et al. |
| 6,573,154 | B1 | 6/2003 | Sridhar et al. |
| 6,620,681 | B1 | 9/2003 | Kim et al. |
| 6,653,195 | B1 | 11/2003 | Gonzalez et al. |
| 6,696,344 | B1 | 2/2004 | Lin et al. |
| 6,815,310 | B2 | 11/2004 | Roberds et al. |
| 6,818,534 | B2 | 11/2004 | Davis et al. |
| 6,858,504 | B2 | 2/2005 | Noble |
| 7,084,028 | B2 | 8/2006 | Fukuzumi |
| 7,094,659 | B2 | 8/2006 | Chen et al. |
| 7,445,973 | B2 | 11/2008 | Gonzalez et al. |
| 7,482,656 | B2 | 1/2009 | Luo et al. |
| 7,625,776 | B2 | 12/2009 | Wells et al. |
| 8,325,515 | B2 | 12/2012 | Okhonin et al. |
| 8,552,525 | B2 * | 10/2013 | Wells .............. H01L 21/84 257/510 |
| 2001/0055838 | A1 | 12/2001 | Walker et al. |
| 2005/0017282 | A1 | 1/2005 | Dobuzinsky et al. |
| 2006/0292787 | A1 | 12/2006 | Wang et al. |
| 2007/0012996 | A1 | 1/2007 | Yoon et al. |
| 2009/0127613 | A1 | 5/2009 | Ikehashi |
| 2011/0024806 | A1 | 2/2011 | Radic et al. |
| 2013/0001739 | A1 | 1/2013 | Wells et al. |
| 2014/0021577 | A1 | 1/2014 | Wells et al. |

OTHER PUBLICATIONS

Definition of "separated", http://www.merriam-webster.com/dictionary/separated> 1 page, downloaded from URL on Jun. 30, 2014.
Definition of "void", http://www.merriam-webster.com/dictionary/separated> 1 page, downloaded from URL on Jun. 30, 2014.
Yang et al., Optimization of Nanoscale Thyristors on SOI for High-Performance High-Density Memories, 2006 IEEE International SOI Conference Proceedings, Oct. 2-5, 2006, pp. 113-114.

\* cited by examiner

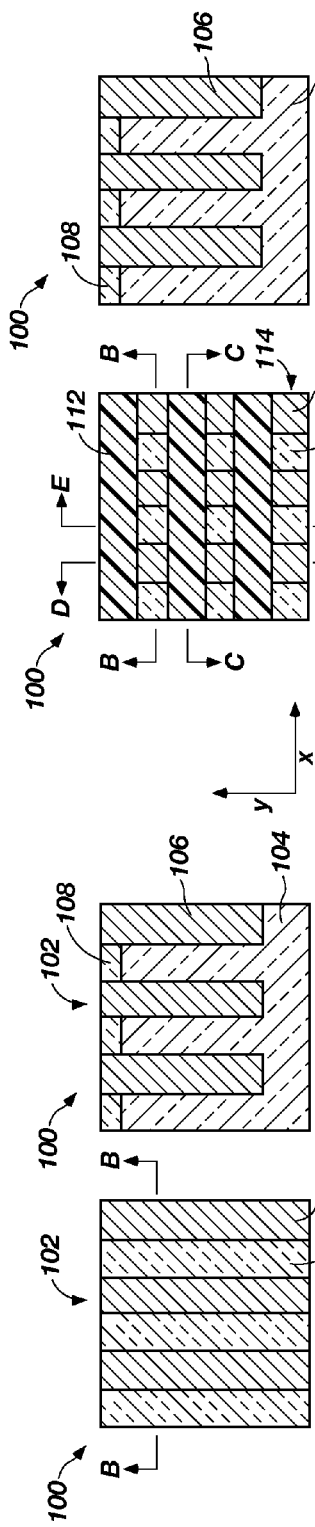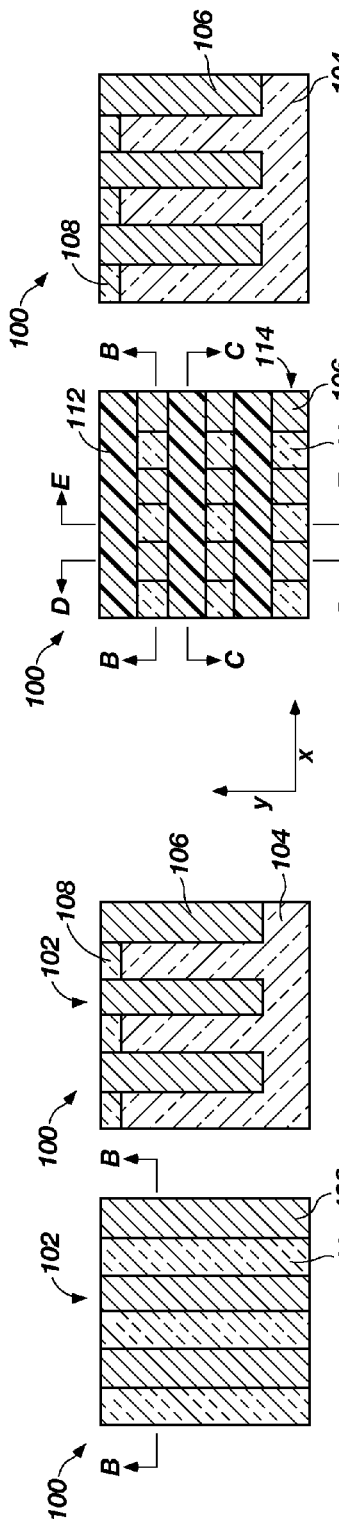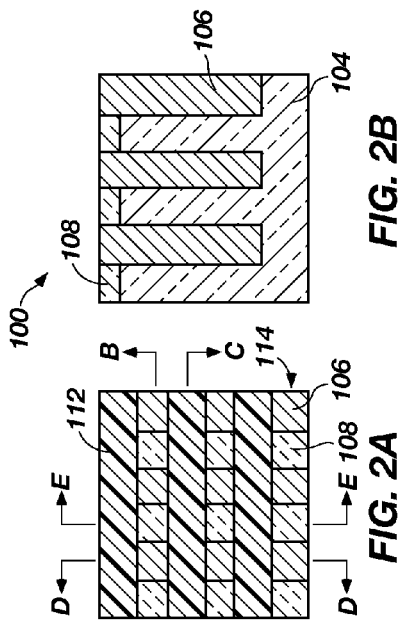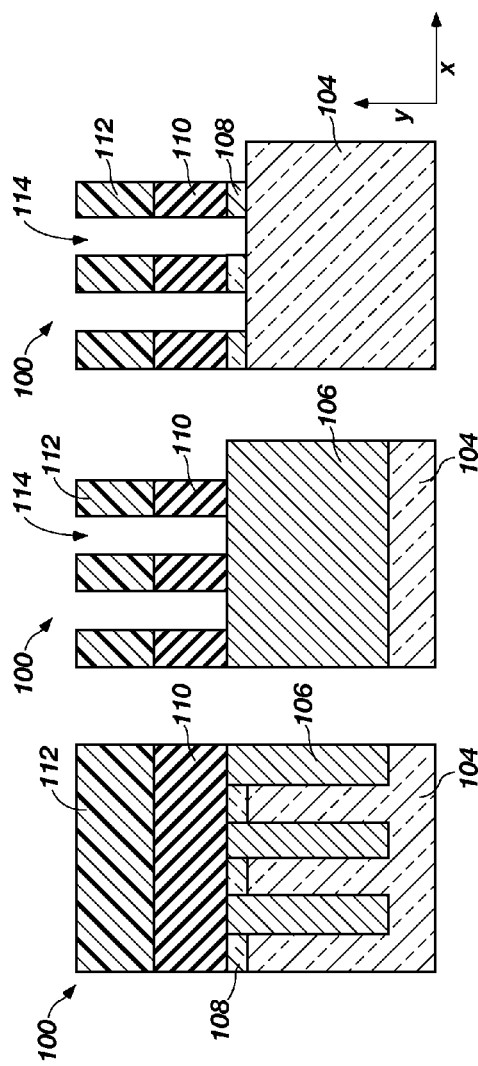

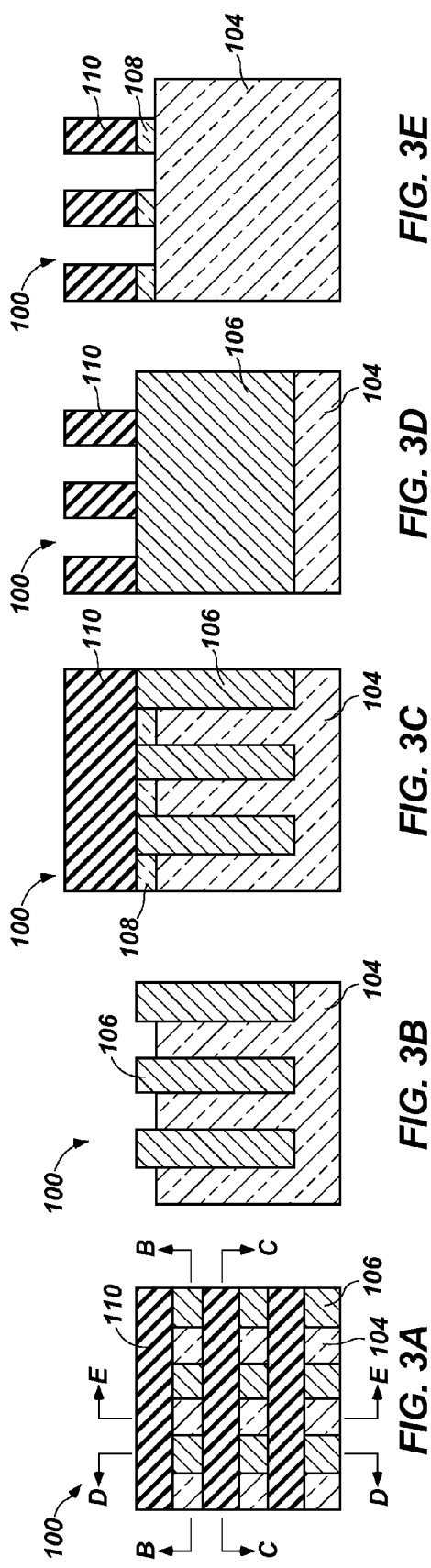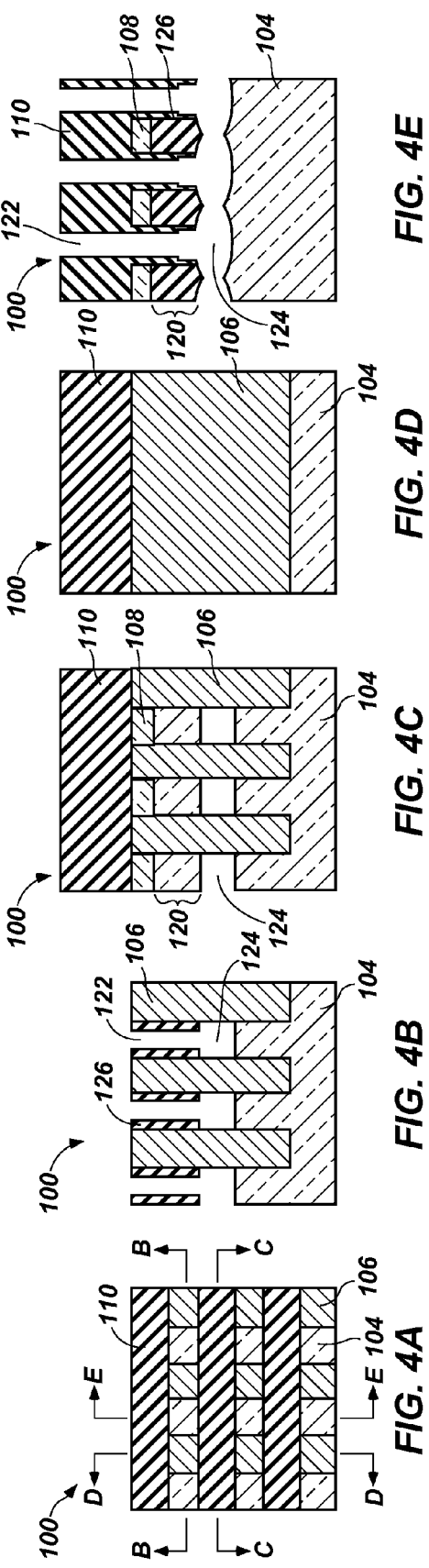

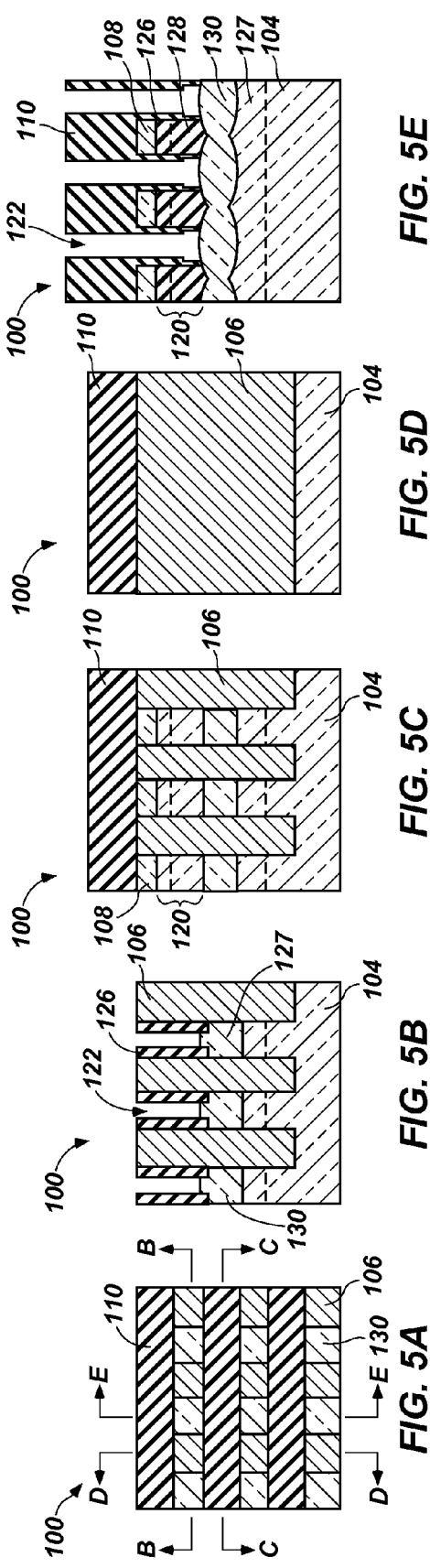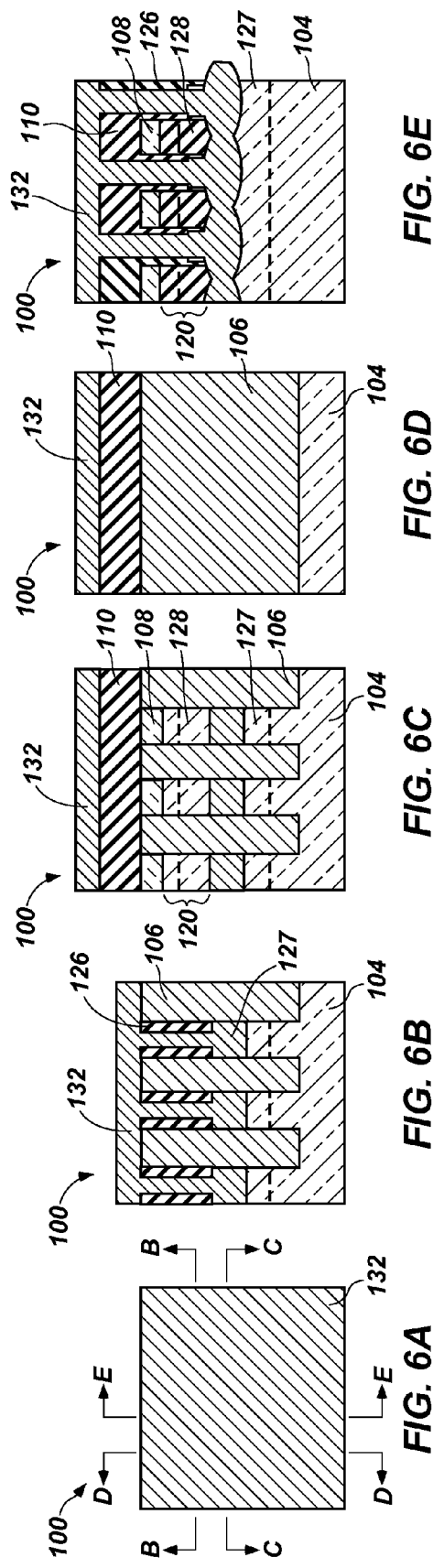

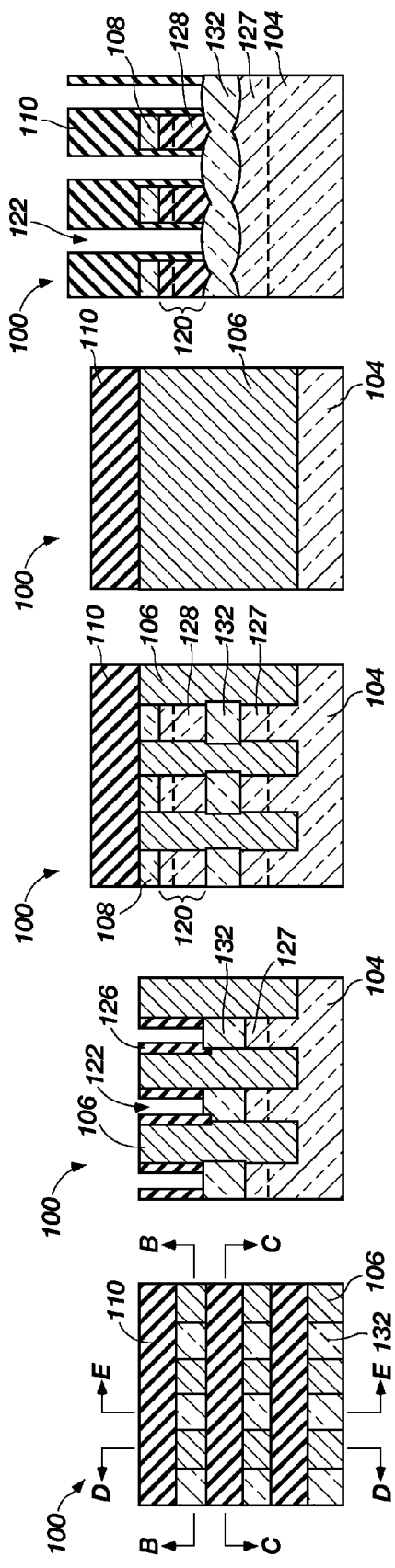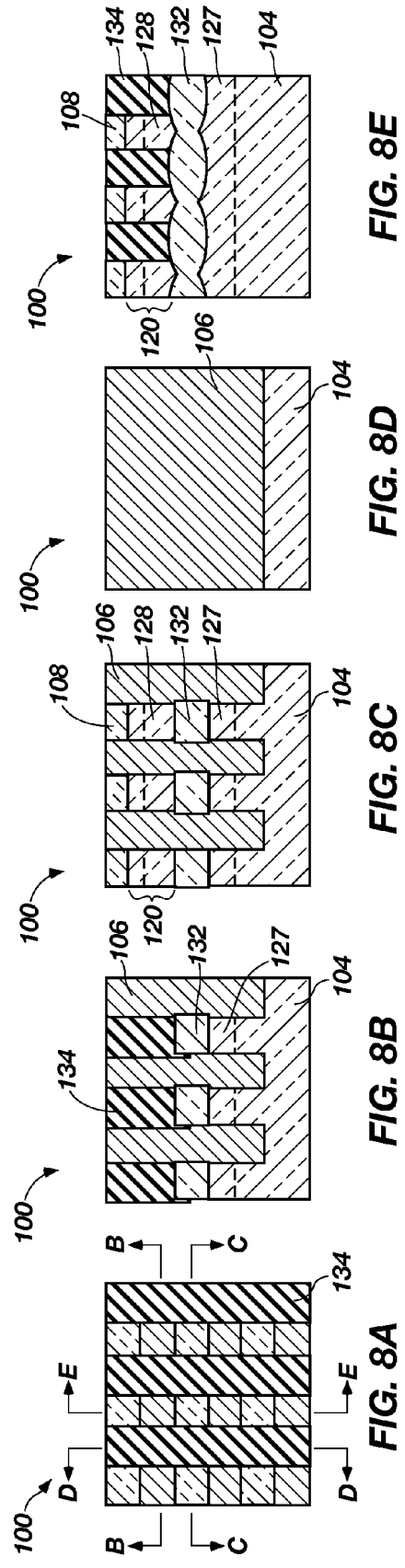

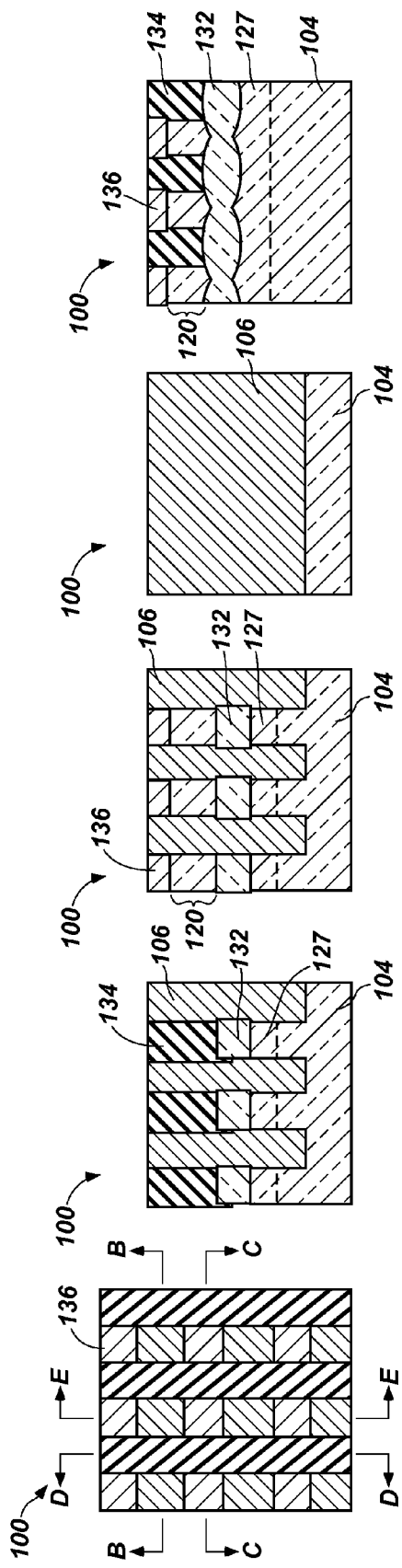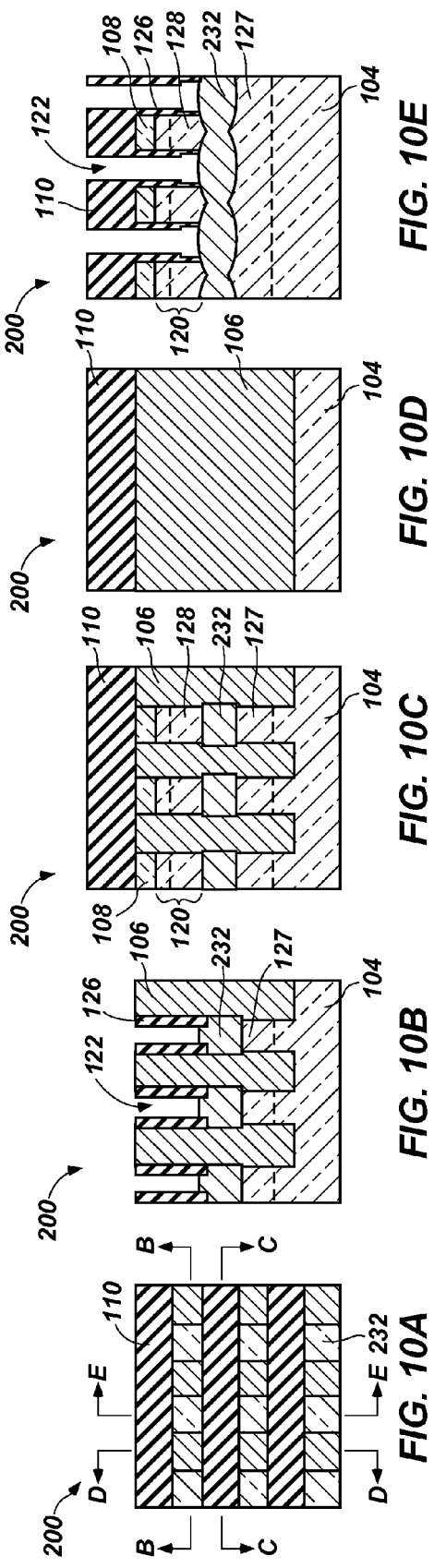

METHODS OF FORMING SEMICONDUCTOR STRUCTURES

CROSS-REFERENCE TO RELATED APPLICATIONS

This application is a divisional of U.S. patent application Ser. No. 14/034,014, filed Sep. 23, 2013, now U.S. Pat. No. 9,006,859, issued Apr. 14, 2015, which application is a divisional of U.S. patent application Ser. No. 13/175,468, filed Jul. 1, 2011, now U.S. Pat. No. 8,552,525, issued Oct. 8, 2013, the disclosure of which is hereby incorporated herein by this reference in its entirety.

TECHNICAL FIELD

Embodiments of the present disclosure relate to semiconductor structures that include bodies of a semiconductor material disposed between rails of a dielectric material for use in memory devices and to methods of forming such semiconductor structures and devices including such structures.

BACKGROUND

The continual demand for enhanced integrated circuit performance has resulted in, among other things, a dramatic reduction of semiconductor device geometries, and continual efforts to optimize the performance of structures within a semiconductor device. A number of improvements and innovations in fabrication processes, material composition, and layout of the active circuit levels of semiconductor devices have resulted in very high-density circuit designs. Increasingly, dense circuit design has not only improved a number of performance characteristics, it has also magnified the importance of semiconductor material properties and behaviors.

In the past, most semiconductor devices were fabricated directly on a bulk silicon substrate. Recently, however, semiconductor manufacturers have started to fabricate semiconductor devices on substrates having varied compositions. One variety of substrate that is gaining in acceptance and popularity is silicon-on-insulator (SOI). The insulator configuration of SOI substrates offers semiconductor device designers a number of performance improvements over plain silicon substrates, such as improved leakage currents and improved latch-up characteristics. SOI substrates generally include a relatively thin silicon material disposed over an insulator, such as an oxide, which is, in turn, disposed over a bulk silicon material. SOI substrates are manufactured in a variety of ways. For example, an oxide may be formed between bulk silicon substrates using conventional wafer bonding and layer transfer techniques and, thereafter, a portion of one of the bulk silicon substrates may be removed, for example, by abrasive planarization, to form a thin silicon film. Removal of the portion of the bulk silicon substrate may be inefficient and expensive due to the quantity of slurry and other consumables, such as polishing pads required for an abrasive planarization process, such as chemical-mechanical planarization (CMP). In addition, conventional planarization procedures may remove an undesirably large amount of the silicon material from the transfer wafer, reducing the number of times the transfer substrate may be used. In addition, an amount of the silicon material transferred from the bulk wafer that ends up in the SOI substrate, which is referred to herein as "transfer yield," may be relatively low as a result of the need for subsequent removal of a substantial portion of the transferred silicon material.

SOI substrates may also be formed by epitaxial growth of silicon (so-called "epitaxial silicon") over a dielectric material, such as an oxide. However, epitaxial silicon is susceptible to the occurrence of crystal defects that may degrade the performance of devices fabricated thereon.

Regardless of the method used to produce the SOI substrate, most conventional semiconductor fabrication processes do not encompass the actual production of the SOI substrate. Instead, semiconductor fabrication processes involve forming devices on an already completed SOI substrate that is purchased from a manufacturer. Such completed SOI substrates are generally very expensive and, thus, may be cost prohibitive depending on the semiconductor device being fabricated.

Additionally, as noted above, SOI substrates are susceptible to a number of problems not encountered with bulk silicon substrates. For example, during formation of the SOI substrate, crystal defects may be incorporated into the silicon material, causing charge migration in completed semiconductor devices. Thus, the presence of defects in the silicon material of an SOI substrate may cause a number of performance and reliability problems.

BRIEF DESCRIPTION OF THE DRAWINGS

FIGS. 1A through 9E illustrate an embodiment of a method for forming a semiconductor structure according to the present disclosure;

FIGS. 10A through 10E illustrate another embodiment of a method for forming a semiconductor structure according to the present disclosure.

DETAILED DESCRIPTION

Figure 11:
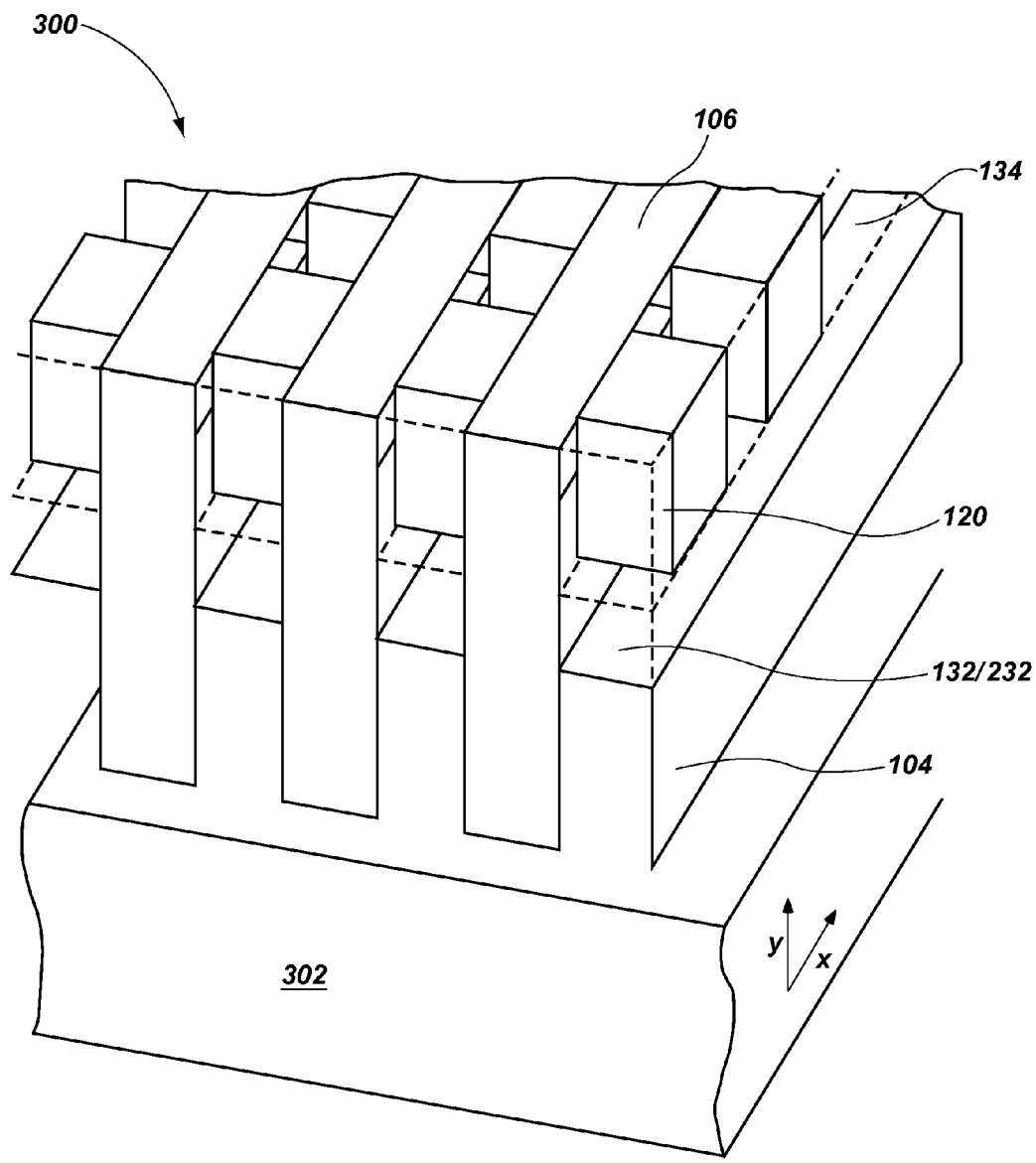
FIG. 11 illustrates an embodiment of a semiconductor device including a semiconductor structure such as those formed according to the methods described with respect to FIGS. 1A through 10E.

Methods of forming semiconductor structures are disclosed, as are semiconductor structures that include a conductive material underlying bodies of a semiconductor material. As used herein, the term "body" means and includes a volume of a semiconductor material. The bodies may be formed having a plurality of rails of a dielectric material between which the bodies of the semiconductor material are suspended. As used herein, the term "rails" means and includes a body of material having a substantially elongated shape, which may be used as a support for the bodies of semiconductor material. The conductive material, such as a metal, may be used as an interconnect structure to electrically couple components of memory devices. By way of example and not limitation, the conductive material may be used as a conductive line to electrically interconnect diode structures of a phase-change memory (PCRAM) device. As another example, the conductive material may be used as a buried strap to electrically interconnect memory cells, such as thyristors, and access devices, such as transistors. For example, the conductive material may be used to electrically interconnect thyristors and transistors of a thyristor random access memory (TRAM) device. The semiconductor structures provide metal interconnects for forming memory devices while reducing transfer yield and defectivity issues associated with conventional silicon-on-insulator (SOI) substrates.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Also, the semiconductor structures described below do not form a complete semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the invention. The illustrations presented herein are not meant to be actual views of any particular system, logic device, semiconductor device or memory cell, but are merely idealized representations that are employed to describe the embodiments of the present disclosure. The drawings presented herein are not necessarily drawn to scale. Additionally, elements common between drawings may retain the same numerical designation.

FIGS. 1A and 1B are simplified illustrations of a semiconductor structure 100 that includes a plurality of trenches 102 in a substrate 104, each of which is filled with a dielectric material 106. As used herein, the term "substrate" means and includes any structure that includes a semiconductor type material including, for example, silicon, germanium, gallium arsenide, indium phosphide, and other III-V or II-VI type semiconductor materials. The substrate 104 may include, for example, not only conventional substrates but also other bulk semiconductor substrates such as, by way of example and not limitation, silicon-on-insulator (SOI) type substrates, silicon-on-sapphire (SOS) type substrates, and epitaxial layers of silicon supported by another material. Furthermore, when reference is made to a "substrate" in the following description, previous process acts may have been utilized to at least partially form elements or components of a circuit or device in or over a surface of the substrate.

As shown in FIG. 1A, which is a top-down view of the semiconductor structure 100, the trenches 102 may be formed extending in a first direction y. As will be described in detail, the trenches 102 may be formed extending through a mask 108 overlying the substrate (not shown) and into the substrate (not shown). The semiconductor structure 100, shown in FIGS. 1A and 1B, includes three (3) rows of trenches 102. However, the semiconductor structure 100 may include any number of trenches 102.

Referring to FIG. 1B, which is a cross-sectional view of the semiconductor structure 100 shown in FIG. 1A taken along section line B-B, the trenches 102 may be formed by removing portions of the substrate 104 with respect to the mask 108. The mask 108 may be formed from a material that may be etched with respect to the substrate 104. By way of example and not limitation, the mask 108 may be formed from silicon nitride. Before forming the trenches 102, the mask 108 may be formed over an entire surface of the substrate 104 using a conventional deposition process, such as a chemical vapor deposition (CVD) process, an atomic layer deposition (ALD) process or a physical vapor deposition (PVD) process. Conventional lithographic techniques may be used to pattern the mask 108 so that areas of the substrate 104 in which the trenches 102 will be formed are exposed through the mask 108.

The trenches 102 may then be formed by removing the exposed portions of the substrate 104 with respect to the mask 108 using, for example, a conventional etching process. By way of example and not limitation, a reactive ion etching (RIE) process using oxygen ($O_2$) gas and tetrafluoromethane ($CF_4$) gas may be performed to selectively remove the substrate 104 with respect to the mask 108. The trenches 102 may have an aspect ratio of, for example, between about 1:1 and about 20:1 and, more particularly, between about 5:1 and about 10:1.

The trenches 102 in the substrate 104 may then be filled with the dielectric material 106, such as, an oxide material (e.g., silicon dioxide). For example, the dielectric material 106 may be formed over the semiconductor structure 100 (i.e., over exposed surfaces of the substrate 104 and the mask material 108) using a conventional deposition process, such as a CVD process or a PVD process. Excess dielectric material 106 may be subjected to a removal process, such as an abrasive planarization process (e.g., a chemical-mechanical planarization (CMP) process or a mechanical planarization process), to remove portions of the dielectric material 106 overlying the mask 108. The remaining portions of the dielectric material 106 between remaining portions of the substrate 104 may be referred to herein as "rails" of the dielectric material 106.

FIGS. 2A through 2E are simplified illustrations of the semiconductor structure 100 after a second dielectric material 110 and a second mask 112 have been formed over an upper surface of the substrate 106. As shown in FIG. 2A, which is a top-down view of the semiconductor structure 100 following the processes as described immediately below, the second dielectric material 110 and the second mask 112 may be formed in a plurality of rows extending in a direction x, that is substantially perpendicular to the direction y in which the trenches 102 were formed. By way of example and not limitation, the second dielectric material 110 may be formed from an oxide material (e.g., silicon dioxide) and the second mask 112 may be formed from amorphous carbon. For example, the second dielectric material 110 and the second mask 112 may, respectively, be formed over an entire surface of the semiconductor structure 100 and, thereafter, conventional lithographic techniques may be used to pattern the second mask 112 so that areas of the second dielectric material 110 in which another plurality of trenches 114 will be formed are exposed through the second mask 112. The exposed second dielectric material 110 may then be removed to form the trenches 114. In embodiments in which the second dielectric material 110 is formed from silicon dioxide, a RIE process using a nitrogen trifluoride ($NF_3$)-based gas, a chlorine (Cl)-based gas or a bromide (Br)-based gas may be performed to selectively remove the silicon dioxide with respect to the second mask 112.

FIG. 2B is a cross-sectional view of the semiconductor structure 100 shown in FIG. 2A, taken along section line B-B. As shown in FIG. 2B, surfaces of the mask 108 and the dielectric material 106 remain exposed through the trenches 114 (FIG. 2A) in the second dielectric material 110.

Referring to FIG. 2C, which is a cross-sectional view of the semiconductor structure 100 shown in FIG. 2A, taken along section line C-C, the second dielectric material 110 and the second mask 112 overlie surfaces of the mask 108 and the dielectric material 106 between the trenches 114 (FIG. 2A).

As shown in FIG. 2D, which is a cross-sectional view of the semiconductor structure 100 shown in FIG. 2A, taken along section line D-D, remaining portions of the second dielectric material 110 (having remaining portions of the second mask 112 thereon) protrude from a surface of the dielectric material 106 between the trenches 114. The remaining portions of the second dielectric material 110 and the second mask 112 may extend in the direction x substantially perpendicular to the rails of dielectric material 106 (FIGS. 2B and 2C). As shown in FIG. 2E, which is a cross-sectional view of the semiconductor structure 100 shown in FIG. 2A, taken along section line E-E, the remaining portions of the second dielectric material 110 and the second mask 112 may overlie the mask 108.

FIGS. 3A through 3E are simplified illustrations of the semiconductor structure 100 after removing the second mask 112 and portions of the mask 108 exposed through the second dielectric material 110. As shown in FIG. 3A, which is a top-down view of the semiconductor structure 100, removing portions of the mask 108 (FIG. 2A) exposed through the second dielectric material 110 exposes surfaces of the substrate 104. FIGS. 3B through 3E are cross-sectional views of the semiconductor structure 100 shown in FIG. 3A taken along section lines B-B, C-C, D-D and E-E, respectively.

Referring to FIGS. 3A and 3B, removing the portions of the mask 108 with respect to the dielectric material 106 exposes the surfaces of the substrate 104 and results in regions of the dielectric material 106 protruding above the exposed surfaces of the substrate 104. In embodiments in which the mask 108 is formed from silicon nitride, the silicon nitride may be removed with respect to the dielectric material 106, the second dielectric material 110 and, if present, the second mask 112 using a conventional wet etch process using, for example, phosphoric acid ($H_3PO_4$).

Referring to FIGS. 3A, 3C, 3D and 3E, removing the second mask 112 exposes surfaces of the underlying second dielectric material 110. In embodiments in which the second mask 112 is formed from a photoresist material, a conventional ashing processes may be performed to remove the photoresist material.

FIGS. 4A through 4E are simplified illustrations of the semiconductor structure 100 after removing portions of the substrate 104 to form bodies 120 suspended between the adjacent rails of the second dielectric material 110. FIG. 4A is a top-down view of the semiconductor structure 100 and FIGS. 4B through 4E are cross-sectional views of the semiconductor structure 100 shown in FIG. 4A taken along section lines B-B, C-C, D-D and E-E, respectively. Referring to FIGS. 4B and 4E, portions of the substrate 104 may be removed to form openings 122 using conventional isotropic etch processes. A first isotropic etch process may be used to remove the portions of the substrate 104 selective to the dielectric materials 106 and 110 resulting in formation of the openings 122 having substantially straight sidewalls extending into the substrate 104. For example, surfaces of the substrate 104 exposed through the dielectric materials 106 and 110 (FIG. 4A) may be exposed to at least one of nitrogen trifluoride and sulfur hexafluoride to remove the material from the substrate 104 forming the regions of the openings 122, each defined by opposite sidewalls of the dielectric material 106 and the substrate 104.

To separate the bodies 120 from the substrate 104, a portion of the substrate 104 between the rails of the dielectric material 106 may be removed to form a widened extension 124 at a terminal end of each of the openings 122. Referring to FIGS. 4B and 4E, a liner 126 may be formed over exposed sidewalls of the rails of dielectric material 106 protruding from the substrate 104 (FIG. 4B) and over sidewalls of the mask 108 and the substrate 104 (FIG. 4E) and portions of the liner 126 may be removed to expose surfaces of the substrate 104 in which the widened extensions 124 will be formed. The liner 126 may be formed from any material that is selectively etchable with respect to the substrate 104, such as an oxide material or a polymer material. In embodiments in which the substrate 104 is formed from silicon, the liner 126 may be formed from silicon dioxide using a conventional deposition process, such as, a CVD process, a PVD process or a thermal oxidation process. The liner 126 may also be formed from a polymeric organic material (i.e., a so-called "organic polymer") using a conventional deposition process, such as a CVD process. The portions of the liner 126 may be removed to expose such surfaces of the substrate 104 using an anisotropic etching process. In embodiments in which the liner 126 is formed from silicon dioxide or an organic polymer, the liner 126 may be exposed to at least one of methane ($CF_4$), trifluoromethane ($CHF_3$), difluoromethane ($CH_2F_2$), hydrogen bromide (HBr) and chlorine gas ($Cl_2$) to remove portions of the liner 126 from the lower region of the trench 102. As shown in FIGS. 4B and 4E, the liner 126 appears to be broken into two separate segments. It is to be understood, however, that liner 126 may extend over a lateral periphery of sidewalls of substrate 104 and the rails of dielectric material 106.

Referring to FIGS. 4C and 4E, material may be laterally removed from the substrate 104 in the direction y (i.e., the direction substantially parallel to the rails of the dielectric material 106) to form the widened extension 124 at the terminal end of each of the openings 122. A second isotropic etch process may be used to laterally remove material from the substrate 104 in the direction y, which results in formation of the widened extensions 124, which isolate the bodies 120 from the remaining portion of the substrate 104. The second isotropic etch process may employ a wet etch chemistry or a dry etch chemistry. Referring to FIG. 4E, the second isotropic etch process may be selected to remove the portions of the substrate 104 with respect to the liner 126 to form widened extensions 124 having a substantially circular and rounded cross-sectional profile. Such an etch process may, thus, be referred to as a so-called "bowl etch." For example, in embodiments in which the substrate 104 is formed from silicon, the silicon may be removed with respect to the liner 126 by exposing the silicon to an etch chemistry that includes at least one of nitrogen trifluoride and sulfur hexafluoride and, optionally, a moderating agent, such as, hydrogen bromide, trifluoromethane, difluoromethane and oxygen ($O_2$). The moderating agent may be included in the etch chemistry to suppress lateral etching, resulting in widened extensions 124 having substantially rounded cross-sectional profiles (i.e., a so-called "bowl-shaped" cross-sectional profile).

The widened extensions 124 may be formed to interconnect with one another to form a continuous void underlying the bodies 120 and isolating the bodies 120 from a remaining portion of the substrate 104. As shown in FIG. 4E, a cross-sectional profile of the void formed by the widened extensions 124 may include a series of curved projections (i.e., a scalloped cross-sectional profile). For example, the widened extensions 124 may be formed by undercutting the substrate 104. The terms "undercut" and "undercutting," as used herein, mean and include removing material lateral to a surface of the substrate 104 to form an open volume or void that extends under an overlying portion of the substrate 104 (i.e., bodies 120). Undercutting the substrate 104 results in the formation of the widened extensions 124 at terminal ends of the openings 122 in the substrate 104. The widened extensions 124 separate the bodies 120 from the remaining portion of the substrate 104.

As another non-limiting example, the openings 122 may be formed using an etching process such as that described in U.S. Patent Application Serial No. 2006/0292787 to Wang et al., filed Jun. 28, 2005, now U.S. Pat. No. 7,935,602, issued May 3, 2011. Referring to FIGS. 4B, 4C and 4E, the liner 126 may be formed during removal of the substrate 104 using the isotropic etch processes. By way of example and not limitation, the liner 126 may be formed from an oxide material or an organic polymer. In embodiments in which the substrate 104 is formed from silicon, the liner 126 may be formed from silicon dioxide in situ during the isotropic etch process by oxidizing the silicon with an oxygen plasma. The liner 126 may also be formed from a polymeric organic material (i.e., a so-called "organic polymer"). In embodiments in which the liner 126 is formed from an organic polymer, the organic polymer may be formed directly on exposed surfaces of the substrate 104 (as shown), or may be formed over an intervening material, such as, a native oxide. For example, the liner 126 may be formed in situ during the isotropic etch process by exposing surfaces of the substrate 104 or, if present, the native oxide to least one of trifluoromethane, difluoromethane, methane, ethane ($C_2H_6$), ethylene ($C_2H_4$), ammonia ($NH_3$) and hydrogen bromide.

During the isotropic etch process, material may be removed from the substrate 104 to form the region of the opening 122 having substantially straight sidewalls extending into the substrate 104 while the liner 126 is formed over the sidewalls. After the region of the opening 122 has reached a desired depth, material may be removed from the substrate 104 in a direction lateral to the surface of the substrate 104 such that the widened extensions 124 are formed at the terminal end of the openings 122.

For example, in embodiments in which the substrate 104 is formed from silicon and the liner 126 is formed from silicon dioxide, the widened extensions 124 may be formed by introducing exposed surfaces of the silicon to an etch chemistry that includes at least one of nitrogen trifluoride ($NF_3$) and sulfur hexafluoride ($SF_6$) and, optionally, a moderating agent, such as, hydrogen bromide, trifluoromethane ($CHF_3$), difluoromethane ($CH_2F_2$) and oxygen ($O_2$). Such moderating agents may be included to suppress lateral etching of the substrate 104 so that the resulting widened extensions 124 have a circular cross-sectional profile rather than being overlying elongated in lateral directions.

As shown in FIGS. 4C and 4E, removing portions of the substrate 104 to form the openings 122 results in formation of the bodies 120 of substrate 104 between the rails of the dielectric material 106. After forming the openings 122, remaining portions of the liner 126 may optionally be removed from the semiconductor structure 100 using a conventional anisotropic etch process, for example.

FIGS. 5A through 5E are simplified illustrations of the semiconductor structure 100 after forming a first doped region 127 in a portion of the substrate 104 underlying the openings 122 and second doped regions 128 in at least a portion of the bodies 120. The first doped region 127 may be formed by doping portions of the substrate 104 exposed within the openings 122 with a desired concentration of a dopant. The first doped region 127 may be formed by a conventional process, such as an ion implantation process or a high-temperature diffusion process. For example, the first doped region 127 may be formed by a plasma doping process, often referred to as a PLAD process, during which a desired dopant is ionized in an ion source, the resultant ions are accelerated to form an ion beam of prescribed energy, and the ion beam is then directed at a surface of a material, such as polysilicon, so that the ions penetrate into the material. As a non-limiting example, if the substrate 104 is formed from a p-type polysilicon, a PLAD process may be used to implant phosphorous or arsenic into the p-type polysilicon such that the first doped region 127 includes an n-type polysilicon. As another example, a thin layer of an n-type material may be deposited over surfaces within the openings 122 and a thermal anneal may be performed, during which n-type dopants migrate into the substrate 104 such that the first doped region 127 includes n-type polysilicon.

By way of example and not limitation, the first and second doped regions 127 and 128 may be formed by forming a doped polysilicon 130 in the openings 122 and performing a thermal annealing process such that the dopants migrate from the doped polysilicon 130 into surrounding regions of the substrate 104 and the bodies 120. FIG. 5A is a top-down view of the semiconductor structure 100 and FIGS. 5B through 5E are cross-sectional views of the semiconductor structure 100 shown in FIG. 5A taken along section lines B-B, C-C, D-D and E-E, respectively. As shown in FIGS. 5B, 5C and 5E, the doped polysilicon 130 is shown filling the widened extensions 124 of the openings 122. However, the doped polysilicon 130 may only partially fill the widened extensions 124 or may at least partially fill remaining portions of the openings 122 overlying the widened extensions 124. The doped polysilicon 130 may be formed from a polysilicon material that is doped with an n-type dopant, such as phosphorous, arsenic, etc. After forming the doped polysilicon 130, an annealing process may be conducted, during which n-type dopants migrate from the doped polysilicon 130 into the substrate 104 such that the bodies 120 at least partially include the second doped region 128 including an n-type material. The second doped region 128 is shown in FIGS. 5C and 5E in a region of each of the bodies 120 adjacent to the doped polysilicon 130. Migration of the n-type dopants during annealing may be controlled such that the second doped region 128 including the n-type material may be formed in any portion, or an entirety, of the bodies 120. After forming the second doped region 128, the doped polysilicon 130 may be removed, for example, using a conventional etch process.

FIGS. 6A through 6E are simplified illustrations of the semiconductor structure 100 after forming a conductive material 132 over the semiconductor structure 100 (i.e., in the openings 122 and over exposed surfaces of the dielectric materials 106 and 110 and, if present, the liner 126). As shown in FIG. 6A, which is a top-down view of the semiconductor structure 100, the conductive material 132 may be formed over an entire exposed surface of the semiconductor structure 100. For example, the conductive material 132 may be formed from a polysilicon material, a metal or a combination/alloy of metals, such as, a tungsten material, a titanium nitride material, a titanium silicide material, a tantalum nitride material or a tungsten silicide material. The conductive material 132 may be formed over the semiconductor structure 100 using a CVD process or a PVD process. FIGS. 6B through 6E are cross-sectional views of the semiconductor structure 100 shown in FIG. 6A taken along section lines B-B, C-C, D-D and E-E, respectively. As shown in FIGS. 6B, 6C and 6E, the conductive material 132 may at least partially fill the openings 122, including the widened extensions 124 at the terminal ends thereof.

FIGS. 7A through 7E are simplified illustrations of the semiconductor structure 100 after a portion of the conductive material 132 extending above the bodies 120 has been removed. As shown in FIG. 7A, which is a top-down view of the semiconductor structure 100, the portion of the conductive material 132 may be removed to expose surfaces of the mask 108. FIGS. 7B through 7E are partial cross-sectional views of the semiconductor structure 100 shown in FIG. 7A taken along section lines B-B, C-C, D-D and E-E, respectively. As shown in FIGS. 7B, 7C and 7E, remaining portions of the conductive material 132 may at least partially fill the widened extensions 124. By way of example and not limitation, the portion of the conductive material 132 overlying the widened extensions 124 in the substrate 104 may be removed using, for example, a conventional selective etch process.

FIGS. 8A through 8E are simplified illustrations of the semiconductor structure 100 after forming another dielectric material 134 over the semiconductor structure 100 and removing portions of the second dielectric material 110 overlying the dielectric material 106 and the mask 108. As shown in FIG. 8A, which is a top-down view of the semiconductor structure 100, the dielectric material 134 may fill remaining portions of the openings 122 (FIGS. 7B and 7E). The dielectric material 134 may be formed over an entire surface of the semiconductor structure 100 and in remaining portions of the openings 122. FIGS. 8B through 8E are cross-sectional views of the semiconductor structure 100 taken along section lines B-B, C-C, D-D and E-E, respectively. As show in FIGS. 8A, 8C and 8E, after forming the dielectric material 134 over the semiconductor structure 100, portions of the second dielectric material 110 overlying the mask 108 may be removed such that the dielectric material 134 fills the remaining portions of the openings 122 overlying the conductive material 132. By way of example and not limitation, the dielectric material 134 may be formed from an oxide material (e.g., silicon dioxide) and may be formed over the semiconductor structure 100 using a conventional deposition process, such as a CVD process, an ALD process or a PVD process.

FIGS. 9A through 9E are simplified illustrations of the semiconductor structure 100 after the mask 108 has been removed and a silicide material 136 has been formed over each of the bodies 120. As shown in FIG. 9A, which is a top-down view of the semiconductor structure 100, the silicide material 136 may be formed by forming a p-type material (not shown) over exposed regions of the bodies 120 suspended between the rails of the dielectric material 106 and converting at least a portion of the p-type material to the silicide material 136. FIGS. 9B through 9E are cross-sectional views of the semiconductor structure 100 taken along sections lines B-B, C-C, D-D and E-E, respectively. As shown in FIGS. 9C and 9E, the p-type material may be formed by a conventional process, such as a deposition process, an ion implantation process or a high-temperature diffusion process. For example, the p-type material may be deposited in voids between the rails of dielectric material 106 formed by removing the mask 108 (FIGS. 8A, 8C and 8E) using a conventional PVD process. As another example, the p-type material may be formed by depositing p-type polysilicon over surfaces of the bodies 120 and performing a thermal anneal during which p-type dopants migrate into the bodies 120 to form the p-type material. In embodiments in which the bodies 120 are formed from polysilicon, the polysilicon may be exposed to a p-type dopant (e.g., boron, aluminum, etc.) such that a p-type polysilicon is formed.

After forming the p-type polysilicon, the silicide material 136 may be formed by depositing a metal (not shown) over the semiconductor structure 100 exposing the semiconductor structure to a temperature sufficient to react the silicon of the p-type polysilicon and the metal. For example, the silicide material 136, may be formed from cobalt silicide, nickel silicide, titanium silicide, etc.

The present disclosure includes methods of forming semiconductor structures. For example, a dielectric material may be formed in a plurality of trenches in a substrate and portions of the substrate between the dielectric material may be removed to form a plurality of openings extending into the substrate. Each of the plurality of openings may be defined by opposing sidewalls of the dielectric material and opposing sidewalls of the substrate. Material may be laterally removed from the substrate through surfaces thereof exposed within the plurality of openings to form a continuous void within the substrate.

In another example, a plurality of trenches in a substrate may be substantially filled with a first dielectric material. The plurality of trenches may extend through the substrate in a first direction. A mask may be formed over portions of the substrate and the first dielectric material and may expose surfaces of the substrate and the first dielectric material in a second direction substantially perpendicular to the first direction. Portions of the substrate exposed through the mask may be removed to form a plurality of openings separating a first area of the substrate from a second area of the substrate. A conductive material may then be formed in the plurality of openings.

FIGS. 10A through 10E illustrate another embodiment of a method of forming a semiconductor structure 200 that includes a conductive material 232 underlying bodies 120 of a semiconductor material. The semiconductor structure 200 may be formed having openings 122 overlying portions of the substrate 104 between the rails of dielectric material 106, and the liner 126 may be formed over the rails of dielectric material 106, as described above with respect to FIGS. 1A through 4E. More specifically, openings 122 may be formed by removing portions of the substrate 104 selective to the dielectric materials 106 and 110 and the liner 126 may then be formed over exposed sidewalls of the dielectric material 106 (FIG. 10B) and over sidewalls of the mask 108 (FIG. 10E), as described above with respect to FIGS. 4B and 4E.

FIG. 10A is a top-down view of the semiconductor structure 200 after forming the conductive material 232. FIGS. 10B through 10E are cross-sectional views of the semiconductor structure 100, shown in FIG. 5A, taken along section lines B-B, C-C, D-D and E-E, respectively. As shown in FIGS. 10B, 10C and 10E, exposed portions of the substrate 104 in the openings 122 may be converted to a silicide material to form the conductive material 232 between the bodies 120. By way of non-limiting example, the conductive material 232 may be formed from a non-transition metal silicide, such as cobalt silicide ($CoSi_2$), which is often referred to as "$CoSi_x$," titanium silicide ($TiSi_2$), tungsten silicide ($WSi_2$) or nickel silicide ($NiSi_2$). For example, the conductive material 232 may be formed by depositing a non-transition metal, such as cobalt (Co), titanium (Ti), tungsten (W) or nickel (Ni), in the openings 122 and heating to temperature sufficient to cause the non-transition metal to react with surrounding regions of the substrate 104 (FIGS. 4A through 4C and 4E), forming the conductive material 232. As the non-transition metal reacts with the surrounding regions of the substrate 104, the silicide material may form in a direction lateral to the surface of the substrate 104 to form the conductive material 232, which continuously extends under the bodies 120 and isolates the bodies 120 from an underlying portion of the substrate 104. As shown in FIG. 10E, a cross-sectional profile of the conductive material 232 may include a series of curved projections (i.e., a scalloped cross-sectional profile). For example, if the substrate 104 comprises polysilicon, cobalt may be deposited over the polysilicon and annealed at a temperature of between about 400° C. to about 600° C. to form a conductive material 232 including cobalt silicide. As shown in FIGS. 10B, 10C and 10E, the conductive material 232 may overlie the first doped region 127 of the substrate 104. The first doped region 127 may be formed before or after forming the openings 122 using conventional doping techniques, such as those described with respect to FIGS. 4B, 4C and 4E. For example, the first doped region 127 may be formed to include p-type polysilicon.

At least a portion of the bodies 120 may also be doped to include the second doped regions 128, which are shown in broken lines, using conventional doping techniques, as described with respect to FIGS. 4C and 4E. In embodiments in which the bodies 120 are formed from polysilicon, the polysilicon may be doped with an n-type dopant, such as phosphorous or arsenic, to form second doped regions 128 including n-type polysilicon or may be doped with a p-type dopant, such as boron or aluminum, to form second doped regions 128 including p-type polysilicon. For example, the first doped region 127 may include n-type polysilicon and a region of the substrate 104 underlying the first doped region 127 may include a p-type polysilicon to form a p-n junction. As used herein, the term "p-n junction" means and includes an interface between a region of p-type semiconductor material and a region of n-type semiconductor material. To form a diode structure, p-type polysilicon may be formed over the second doped regions 128.

The present disclosure includes methods of forming semiconductor structures that include a silicide material disposed between areas of a substrate. A plurality of trenches in a substrate may be filled with a dielectric material. Portions of the substrate between adjacent portions of the dielectric material may be removed to form a plurality of openings therein. A liner may be formed over sidewalls of the substrate and the dielectric material exposed within the plurality of openings. The silicide material may be formed in a portion of the substrate between the plurality of openings, and may extend continuously under a first area of the substrate.

As shown in FIGS. 9E and 10E, the semiconductor structures 100 and 200 each include a conductive material 132 and 232 disposed between the bodies 120 and an underlying portion of the substrate 104 from which the bodies 120 are formed. The respective conductive material 132 and 232 of each of the semiconductor structures 100 and 200 electrically interconnects the bodies 120. The semiconductor structures 100, 200 may, thus, be used to form memory devices, such as TRAM devices and PCRAM devices. As configured, the conductive materials 132, 232 may be used to interconnect electrical components of a memory device, such as diode structures of a PCRAM device or thyristors and access transistors of a TRAM device. During processing, the rails of the dielectric material 106 provide support to the bodies 120 of the substrate 104, thus, reducing problems associated with mechanical stress and integrity issues in conventional SOI substrates. Since the semiconductor structures 100 and 200 are formed by removing only portions of the substrate 104 underlying the bodies 120, transfer yield is substantially increased in comparison to that obtainable in fabrication of conventional SOI substrates. Thus, the semiconductor structures 100, 200 provide metal interconnects for forming memory devices while reducing transfer yield and defectivity issues associated with conventional silicon-on-insulator substrates.

The present disclosure includes semiconductor structures including a plurality of rails of dielectric material protruding above a substrate and a plurality of regions of semiconductor material overlying the substrate. Each of the bodies of the plurality may be located between adjacent rails of the plurality of rails of dielectric material.

FIG. 11 shows a perspective view of a semiconductor device 300 that includes at least one semiconductor structure, such as semiconductor structures 100 and 200, which are respectively shown in FIGS. 9E and 10E. The semiconductor device 300 may be, for example, a PCRAM device or a TRAM device. The semiconductor structure 100/200 may be formed on a bulk substrate 302. The semiconductor structure 100/200 may include a plurality of rails of a dielectric material 106 extending from a substrate 104 in a direction longitudinal to the bulk substrate 302 (i.e., in the direction y). A plurality of bodies 120 of a semiconductor material aligned in directions x and y may be suspended between adjacent rails of the dielectric material 106. In the direction x, adjacent bodies 120 may be spaced apart by the rails of the dielectric material 106 and, in the direction y, the adjacent bodies 120 may be spaced apart by dielectric material 134, which is shown in broken lines. The semiconductor structure 100/200 may additionally include a conductive material 132/232, which is shown in broken lines, disposed between the bodies 120 and the substrate 104. While the conductive material 132/232 is illustrated as filling a void between the bodies 120 and the substrate 104 defined by linear surfaces, it will be understood that the void may be defined by substantially scalloped surfaces as described with respect to FIGS. 4E and 10E.

The present disclosure includes semiconductor devices. Such devices may include a semiconductor structure formed over a substrate and a conductive material between the plurality of regions of semiconductor material and the substrate. The semiconductor structure may include a plurality of regions of semiconductor material disposed between regions of a dielectric material extending longitudinally from a surface of the substrate.

CONCLUSION

In one embodiment, the present disclosure includes methods of forming semiconductor structures. Such methods may include forming a dielectric material in a plurality of trenches in a substrate, removing portions of the substrate between the dielectric material to form a plurality of openings extending into the substrate, each of the plurality of openings defined by opposing sidewalls of the dielectric material and opposing sidewalls of the substrate, laterally removing material from the substrate through surfaces thereof exposed within the plurality of openings to form a continuous void within the substrate.

In a further embodiment, a method of forming a semiconductor structure may comprise filling a plurality of trenches in a substrate with a first dielectric material, the plurality of trenches extending through the substrate in a first direction, forming a mask over portions of the substrate and the first dielectric material, the mask exposing surfaces of the substrate and the first dielectric material in a second direction substantially perpendicular to the first direction, removing portions of the substrate exposed through the mask to form a plurality of openings separating a first area of the substrate from a second area of the substrate and forming a conductive material in the plurality of openings.

In another embodiment, a method of forming a semiconductor structure may comprise filling each of a plurality of trenches in a substrate with a dielectric material, removing portions of the substrate between adjacent portions of the dielectric material to form a plurality of openings therein, forming a liner over sidewalls of the substrate and the dielectric material exposed within the plurality of openings and forming a silicide material in a portion of the substrate between the plurality of openings, the silicide material extending continuously under a first area of the substrate.

In yet another embodiment, the present disclosure includes semiconductor structures. The semiconductor structure may comprise a plurality of rails of dielectric material protruding above a substrate and a plurality of regions of semiconductor material overlying the substrate, each of the bodies of the plurality located between adjacent rails of the plurality of rails of dielectric material.

In yet another embodiment, the present disclosure includes semiconductor devices. The semiconductor device may comprise a plurality of regions of semiconductor material disposed between regions of a dielectric material extending longitudinally from a surface of the substrate and a conductive material between the plurality of regions of semiconductor material and the substrate.

While the invention is susceptible to various modifications and alternative forms, specific embodiments have been shown by way of example in the drawings and have been described in detail herein. However, the invention is not intended to be limited to the particular foul's disclosed. Rather, the invention encompasses all modifications, equivalents, and alternatives falling within the scope of the invention as defined by the following appended claims and their legal equivalents.

What is claimed is:

1. A method of forming a semiconductor structure, comprising:
    filling trenches in a substrate with a dielectric material;
    removing portions of the substrate between adjacent portions of the dielectric material to form openings therein;
    forming a liner over sidewalls of the substrate and the dielectric material exposed within the openings; and
    forming a silicide material in a portion of the substrate between the openings, the silicide material extending continuously under an area of the substrate.

2. The method of claim 1, wherein filling trenches in a substrate with a dielectric material comprises:
    forming an oxide material filling each of the trenches in the substrate and overlying surfaces of the substrate between the trenches; and
    removing portions of the oxide material overlying the surfaces of the substrate between the trenches to form rails of the oxide material in the substrate.

3. The method of claim 1, wherein removing portions of the substrate between adjacent portions of the dielectric material to form openings therein comprises:
    forming another dielectric material over surfaces of the substrate and the dielectric material;
    removing portions of the another dielectric material to expose surfaces of the substrate and the dielectric material in a direction substantially perpendicular to the trenches; and
    removing portions of the substrate with respect to the dielectric material and the another dielectric material to form the openings.

4. The method of claim 1, wherein forming a liner over sidewalls of the substrate and the dielectric material exposed within the openings comprises forming another dielectric material over the sidewalls of the substrate and the dielectric material while leaving a surface of the substrate at a bottom of the openings exposed.

5. The method of claim 1, wherein forming a silicide material in a portion of the substrate between the openings comprises forming a p-type material in the portion of the substrate between the openings and converting at least a portion of the p-type material to the silicide material.

6. The method of claim 5, wherein converting at least a portion of the p-type material to the silicide material comprises thermally annealing the at least a portion of the p-type material.

7. The method of claim 1, wherein forming a silicide material in a portion of the substrate between the openings comprises forming a non-transitional metal in the openings and heating the non-transitional metal to form a non-transitional metal silicide in the openings.

8. A method of forming a semiconductor structure, comprising:
    forming rails of a dielectric material above a substrate;
    removing portions of the substrate between adjacent rails of the dielectric material to form openings therein;
    removing exposed portions of the substrate in the openings to form widened extensions at terminal ends of the openings and to form bodies of the substrate between the adjacent rails of the dielectric material;
    extending the widened extensions to form a continuous void within the substrate and under the bodies of the substrate; and
    at least partially filling the openings and the continuous void with a conductive material.

9. The method of claim 8, wherein forming rails of a dielectric material above a substrate comprises forming rails of an oxide material above the substrate.

10. The method of claim 8, wherein forming rails of a dielectric material above a substrate comprises forming the rails of the dielectric material in trenches in the substrate.

11. The method of claim 8, wherein removing portions of the substrate between adjacent rails of the dielectric material to form openings therein comprises conducting a first isotropic etch to form the openings.

12. The method of claim 8, wherein removing exposed portions of the substrate in the openings to form widened extensions at terminal ends of the openings and to form bodies of the substrate between the adjacent rails of the dielectric material comprises separating the bodies of the substrate from remaining portions of the substrate.

13. The method of claim 8, wherein extending the widened extensions to form a continuous void within the substrate and under the bodies of the substrate comprises removing portions of the substrate in a direction parallel to the rails of the dielectric material.

14. The method of claim 8, wherein extending the widened extensions to form a continuous void within the substrate and under the bodies comprises conducting a second isotropic etch to form the continuous void.

15. The method of claim 8, wherein at least partially filling the openings and the continuous void with a conductive material comprises forming an interconnect underlying the bodies of the substrate.

16. The method of claim 8, wherein at least partially filling the openings and the continuous void with a conductive material comprises forming a conductive line underlying the bodies of the substrate.

17. A method of forming a semiconductor structure, comprising:
    forming rails of a dielectric material on a substrate;
    forming bodies of the substrate spaced apart in a first direction by the rails of the dielectric material and spaced apart in a second direction by another dielectric material;
    forming a continuous void within the substrate and under the bodies; and
    forming a conductive material in the continuous void.

18. The method of claim 8, wherein at least partially filling the openings and the continuous void with a conductive material comprises converting exposed portions of the substrate in the openings to a silicide material.

19. The method of claim 17, wherein forming a conductive material in the continuous void comprises isolating the bodies of the substrate from remaining portions of the substrate.

20. The method of claim 17, wherein forming bodies of the substrate spaced apart in a first direction by the rails of the dielectric material and spaced apart in a second direction by another dielectric material comprises forming discrete regions of the substrate suspended between adjacent rails of the dielectric material and separated from remaining portions of the substrate by the continuous void.

\* \* \* \* \*